(12) United States Patent
Rossman et al.

(10) Patent No.: US 9,439,319 B2
(45) Date of Patent: Sep. 6, 2016

(54) CABLE BACKPLANE SYSTEM

(71) Applicant: Tyco Electronics Corporation, Berwyn, PA (US)

(72) Inventors: Jared Evan Rossman, Dover, PA (US); Christopher Ritter, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 293 days.

(21) Appl. No.: 14/103,488

(22) Filed: Dec. 11, 2013

(65) Prior Publication Data

US 2015/0163952 A1 Jun. 11, 2015

(51) Int. Cl.
| | |
|---|---|
| *G06F 1/16* | (2006.01) |
| *H05K 7/14* | (2006.01) |
| *H02G 3/18* | (2006.01) |
| *H02G 3/16* | (2006.01) |
| *H02G 3/08* | (2006.01) |
| *H05K 5/00* | (2006.01) |
| *H05K 7/00* | (2006.01) |
| *G02B 6/00* | (2006.01) |
| *H01J 5/00* | (2006.01) |
| *H01B 7/00* | (2006.01) |
| *H05K 5/03* | (2006.01) |
| *H01R 13/46* | (2006.01) |

(52) U.S. Cl.
CPC ............. *H05K 7/1449* (2013.01); *H02G 3/08* (2013.01); *H02G 3/081* (2013.01); *H02G 3/083* (2013.01); *H02G 3/16* (2013.01); *H02G 3/18* (2013.01)

(58) Field of Classification Search
CPC ........ H02G 3/08; H02G 3/081; H02G 3/083; H02G 3/16; H02G 3/18
USPC .............. 361/679.01, 679.02, 679.4; 174/50, 174/135, 53, 58, 59, 60, 61, 66, 67; 385/135
See application file for complete search history.

(56) References Cited

U.S. PATENT DOCUMENTS

| | | | | |
|---|---|---|---|---|
| 4,034,871 | A * | 7/1977 | Jorgensen | H05K 7/1422 211/41.17 |
| 7,194,181 | B2 * | 3/2007 | Holmberg | G02B 6/4452 385/134 |
| 2008/0096438 | A1 * | 4/2008 | Clark | H01R 13/518 439/713 |
| 2009/0269019 | A1 * | 10/2009 | Andrus | G02B 6/4452 385/135 |

* cited by examiner

*Primary Examiner* — Hoa C Nguyen
*Assistant Examiner* — Binh Tran

(57) ABSTRACT

A cable backplane system includes a plurality of cable connectors interconnected by cables, each cable connector having a header holding signal contacts at a mating end of the header configured for mating with a card connector. A cable tray having side walls surrounds a cavity defining a raceway for the cables. The cable tray has a front edge and holds header frames between the side walls. The header frames hold headers of corresponding cable connectors. An organizer plate is coupled to the cable tray at the front edge. The organizer plate has a plurality of connector channels receiving mating ends of corresponding headers. The connector channels hold the headers in position relative to one another.

20 Claims, 8 Drawing Sheets

CABLE BACKPLANE SYSTEM

BACKGROUND OF THE INVENTION

The subject matter herein relates generally to a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. The cable assemblies need to be held in predetermined locations for mating with line and switch cards. Some known cable backplane systems use a cable rack to hold all of the cables and cable connectors of the cable assemblies and a backplane circuit board to precisely locate the cable connectors, guide features and other components for mating with the line and switch cards. However, aligning the many cable connectors with corresponding openings in the backplane circuit board can be difficult during the assembly process as all of the cable connectors need to be properly positioned simultaneously to load the cable rack onto the backplane. Additionally, because the electrical connections of the system are made by cable assemblies, there may not be a need for the backplane circuit board, which may be an expensive component to manufacture. Elimination of the backplane circuit board may reduce the cost of the system.

A need remains for a cable backplane system that may be assembled in an easy and timely manner.

BRIEF DESCRIPTION OF THE INVENTION

In one embodiment, a cable backplane system is provided that includes a plurality of cable connectors interconnected by cables, each cable connector having a header holding signal contacts at a mating end of the header configured for mating with a card connector. A cable tray having side walls surrounds a cavity defining a raceway for the cables. The cable tray has a front edge and holds header frames between the side walls. The header frames hold headers of corresponding cable connectors. An organizer plate is coupled to the cable tray at the front edge. The organizer plate has a plurality of connector channels receiving mating ends of corresponding headers. The connector channels hold the positions of the headers relative to one another.

In another embodiment, a cable backplane system is provided that includes a backplane circuit board having connector openings extending therethrough and a cable rack coupled to the backplane circuit board. The cable rack includes a plurality of cable connectors interconnected by cables, each cable connector having a header holding signal contacts at a mating end of the header configured for mating with a card connector. A cable tray having side walls surrounds a cavity defining a raceway for the cables. The cable tray has a front edge and holds header frames between the side walls. The header frames hold headers of corresponding cable connectors. An organizer plate is coupled to the cable tray at the front edge. The organizer plate has a plurality of connector channels receiving mating ends of corresponding headers. The connector channels hold the positions of the headers relative to one another. The organizer plate holds the positions of the headers in alignment with the connector openings in the backplane circuit board to guide loading of the headers into the connector openings.

In a further embodiment, a cable backplane system is provided including a plurality of connector bricks each having a plurality of cable connectors interconnected by cables. Each cable connector has a header holding signal contacts at a mating end of the header configured for mating with a card connector. Each connector brick includes a header frame including end spacers and side spacers defining a header opening receiving the plurality of cable connectors. A cable tray has side walls surrounding a cavity defining a raceway for the cables. The cable tray has a front edge and the cable tray holds the connector bricks in the cavity. An organizer plate is coupled to the cable tray at the front edge. The organizer plate has a plurality of connector channels receiving mating ends of corresponding headers. The connector channels hold the positions of the headers relative to one another.

DETAILED DESCRIPTION OF THE INVENTION

Figure 1:
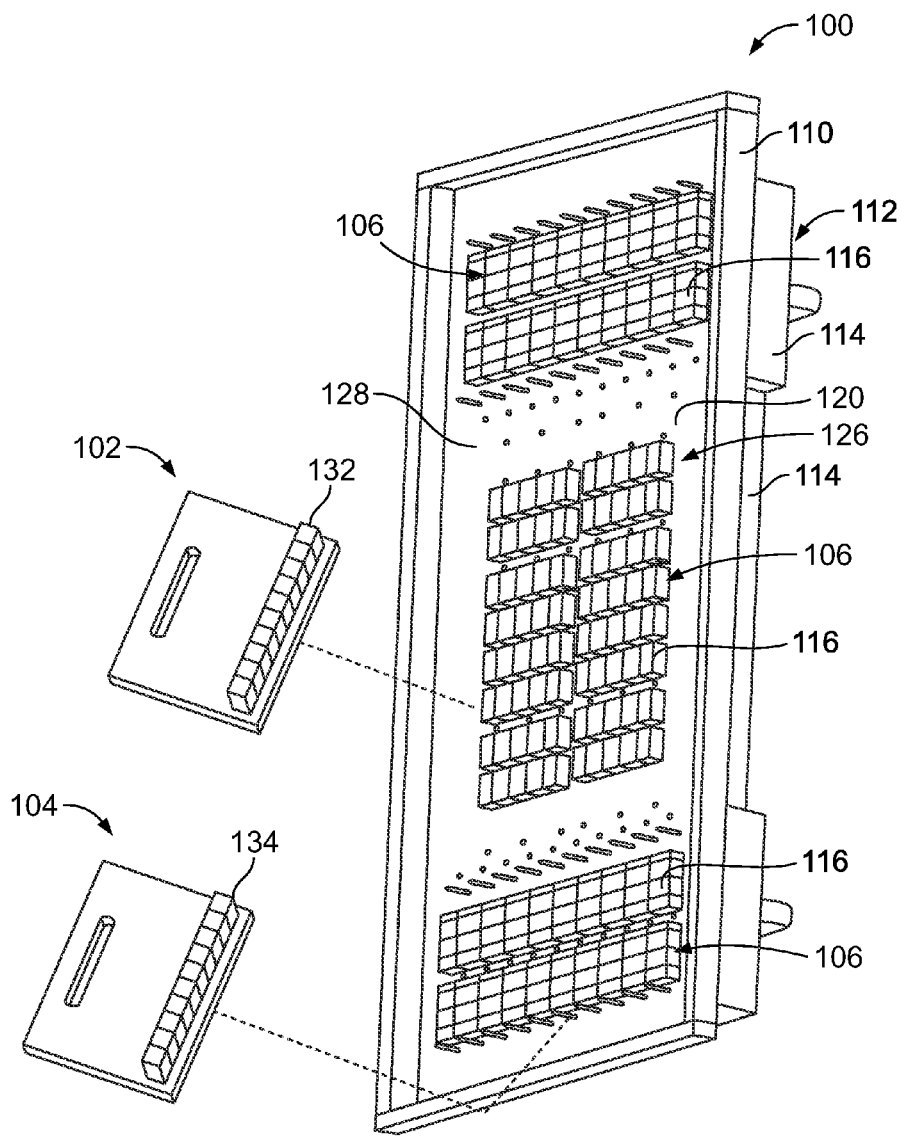
FIG. 1 is a front perspective view of a cable backplane system formed in accordance with an exemplary embodiment.
Figure 2:
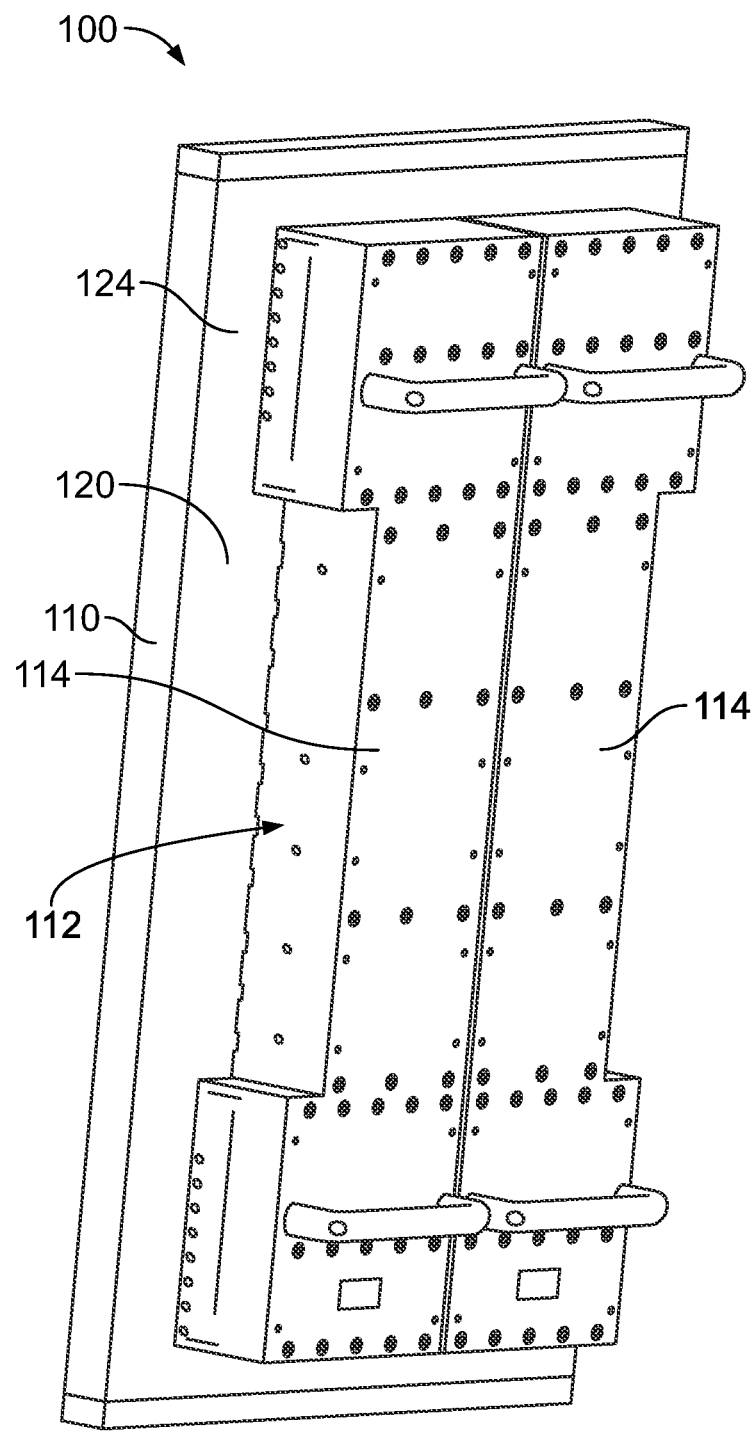
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects with daughtercards, such as line cards 102 and switch cards 104 using cable connector assemblies 106. The cable backplane system 100 may be used to interconnect with other types of connectors and/or cards in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104. The structure manages and organizes the many cables interconnecting the cable connectors 116.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 that supports and/or manages the cables of the cable connector assemblies 106. The cable rack 112 includes a plurality of cable trays 114 that are held together and extend along different portions of the cable backplane system 100. For example, as shown in FIG. 2, two cable trays 114 are provided defining a right half and a left half of the cable rack 112; however greater or fewer cable trays 114 may be provided in alternative embodiments. The cable trays 114 may be generally box-shaped and define raceways for the cables. The cable rack 112 supports a plurality of the cable connectors 116 which form parts of the cable connector assemblies 106.

In an exemplary embodiment, the cable rack 112 includes one or more organizer plates 118 (shown in FIG. 3) along a front of the cable trays 114. The organizer plates 118 are used as a cover or lid for the cable trays 114. The organizer plates 118 are used to position the cable connectors 116 for mating with the line and switch cards 102, 104. Optionally, the cable backplane system 100 may include a backplane circuit board 120. The organizer plates 118 are used to position the cable connectors 116 for reception in the backplane circuit board 120.

The backplane circuit board 120 may be a circuit board and may be manufactured from typical circuit board material, such as FR-4 material. Electrical components, such as power supplies, fans, fixed connectors, and the like may be mechanically and/or electrically connected to the backplane circuit board 120. Such electrical components may be electrically connected to traces of the backplane circuit board 120. The backplane circuit board 120 may be manufactured from other materials in alternative embodiments, such as another dielectric or circuit board material. The cable connectors 116 are not electrically connected to the backplane circuit board 120, as is typical of conventional backplanes, but rather the cable connectors 116 are interconnected by cables extending between the cable connectors 116.

The backplane circuit board 120 and cable rack 112, with the cable connector assemblies 106, are coupled together to form the cable backplane system 100. The cable rack 112 is provided along a rear 124 of the backplane circuit board 120.

The cable connectors 116 extend through connector openings 126 in the backplane circuit board 120 and are presented at a front 128 of the backplane circuit board 120 for mating with the line and switch cards 102, 104.

The organizer plate 118 and/or backplane circuit board 120 hold the cable connectors 116 in precise locations for mating with the line and/or switch cards 102, 104. The organizer plate 118 and/or backplane circuit board 120 have tight tolerances to control mating with the line and switch cards 102, 104. The line and switch cards 102, 104 have card connectors 132, 134, respectively, that mate with corresponding cable connectors 116. The cable connectors 116 need to be precisely positioned relative to the backplane circuit board 120 for mating with corresponding card connectors 132, 134. Optionally, the organizer plate 118 has tighter tolerances than the backplane circuit board 120 and is thus used to position the cable connectors 116 for mating with the card connectors 132, 134.

Figure 3:
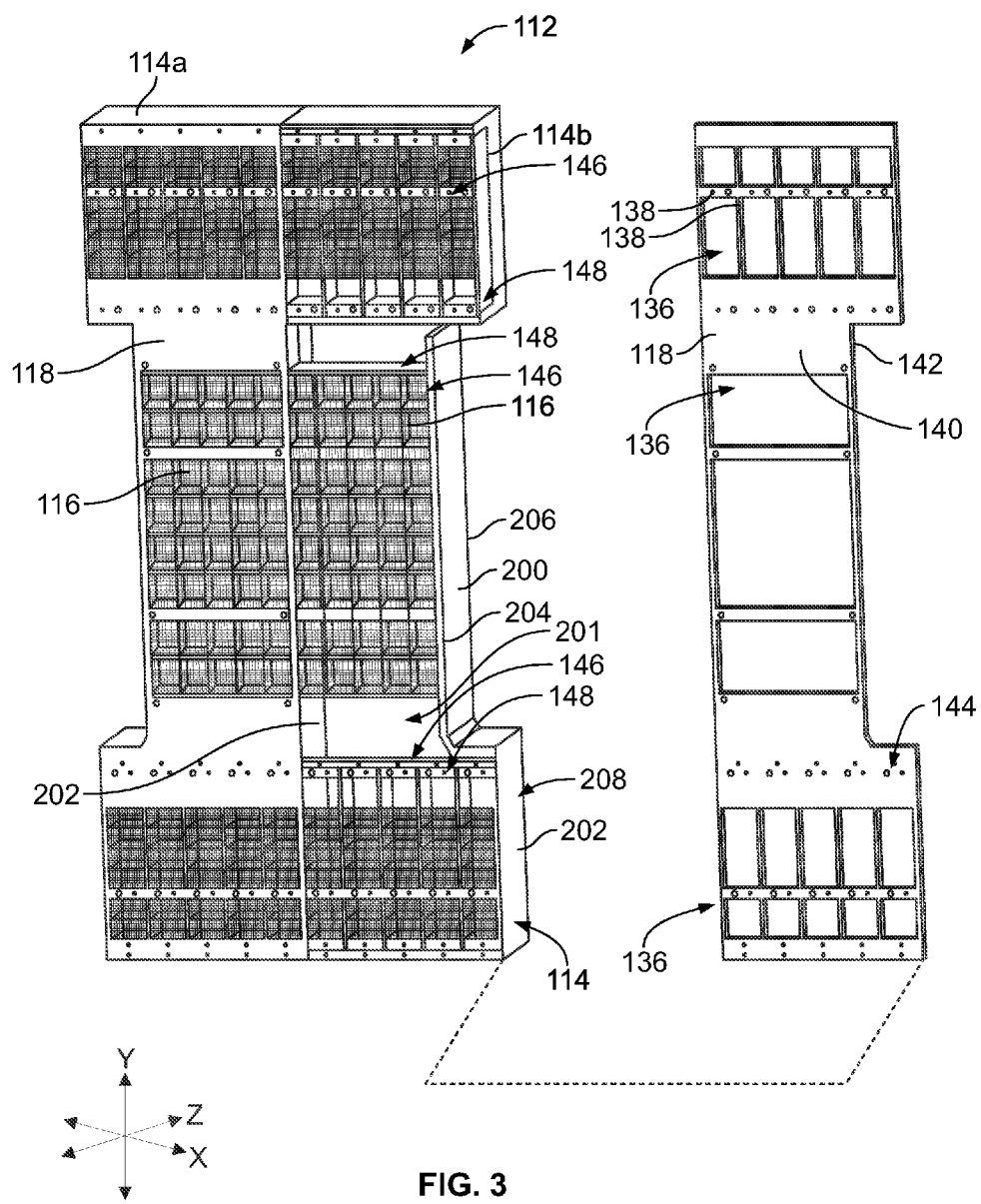
FIG. 3 is a partial assembled view of a cable rack of the cable backplane system showing an organizer plate poised for mounting to a cable tray.

FIG. 3 is a partial assembled view of the cable rack 112 showing one of the organizer plates 118 poised for mounting to the cable tray 114 over the cable connectors 116. The organizer plate 118 includes connector channels 136 that receive the cable connectors 116 and/or portions of the cable trays 114. The connector channels 136 may be single openings that receive single cable connectors 116, or may be large openings that receive many cable connectors 116.

In an exemplary embodiment, the organizer plate 118 is a sheet metal plate having the connector channels 136 stamped out of the sheet metal plate in precise locations. The organizer plate 118 may be manufactured from other materials in alternative embodiments, such as dielectric materials including plastic material, FR-4 material, and the like.

The organizer plate 118 includes longitudinal strips 138 of plate material between the connector channels 136. The tolerances of the sizing and spacing of the connector channels 136 and strips 138 may be tightly controlled to control the relative positions of the cable connectors 116.

The organizer plate 118 includes a front 140 and a rear 142. The rear 142 is mounted to the front of the cable tray 114. The organizer plate 118 may be secured to the cable tray 114 by fasteners, such as threaded fasteners. For example, the organizer plate 118 includes holes 144 therethrough that receive fasteners or other components used to assemble the cable rack 112. The holes 144 may define guide holes that receive guide features such as guide pins.

The cable trays 114 are coupled together into an I-shaped configuration having a first cable tray 114a defining a left half of the cable rack 112 (when viewed from the front) and a second cable tray 114b defining a right half of the cable rack 112. The cable rack 112 may have other shapes in alternative embodiments. In an exemplary embodiment, the cable rack 112 includes header frames 146 used to hold multiple cable connectors 116 together as a unit that can be loaded into the cable tray 114. The header frames 146 position the cable connectors 116 relative to one another to make routing and organizing of the cables and cable connectors 116 into the cable trays 114 easier for the assembler. The header frames 146 and corresponding cable connectors 116 define connector bricks 148 that are loaded into the cable trays 114 as units. The connector bricks 148 may be oriented vertically, horizontally or at other orientations.

Each cable tray 114 includes a frame 200 surrounding a cavity 201 that defines a raceway through which cables 152 are routed. The raceways may be open to one another to allow the cables 152 to be routed from one cable tray 114 into another cable tray 114. The frame 200 includes side walls 202 extending between a front edge 204 and a rear 206 of the cable tray 114. A back wall 208 covers the raceway at the rear 206. The frame 200 is open at the front edge 204 between the side walls 202. The organizer plate 118 is coupled to the front edge 204 to cover or close the cable tray 114. The header frames 146, while holding the plurality of cable connectors 116, are loaded into the cable tray(s) 114, such as through the front. Once the header frames 146 are positioned in the corresponding tray 114, the cable connectors 116 are positioned at or forward of the front edge 204 for loading into the connector channels 136 of the organizer plate 118.

In an exemplary embodiment, the side walls 202 and back wall 208 are sheet metal pieces that are stamped, formed and coupled together, such as using fasteners or other connecting means. The sheet metal may be sufficiently thin to allow the frame 200 to have some flexibility for moving, twisting or otherwise manipulating the cable trays 114 into position relative to the organizer plate 118 to position the cable connectors 116 in the connector channels 136 in the organizer plate 118. Optionally, the cable trays 114a and 114b may be connected to each other with some freedom of movement or float in the connection to allow the cable trays 114a, 114b to move relative to one another to properly align the cable connectors 116 with the connector channels 136 in the organizer plate 118.

In an exemplary embodiment, the cable connectors 116 are movable relative to the header frames 146 to allow the cable connectors 116 to align with the corresponding connector channels 136 during assembly of the cable rack 112 and organizer plate 118. For example, the header frames 146 may allow a limited amount of movement or float in mutually perpendicular X, Y and/or Z directions to allow fine alignment of the cable connectors 116 with the connector channels 136. In an exemplary embodiment, the cable connectors 116 are configured to float within the connector channels 136 relative to the header frames 146 and/or cable trays 114 to obtain a nominal position for aligning to and mating with the corresponding card connectors 132, 134.

Figure 4:
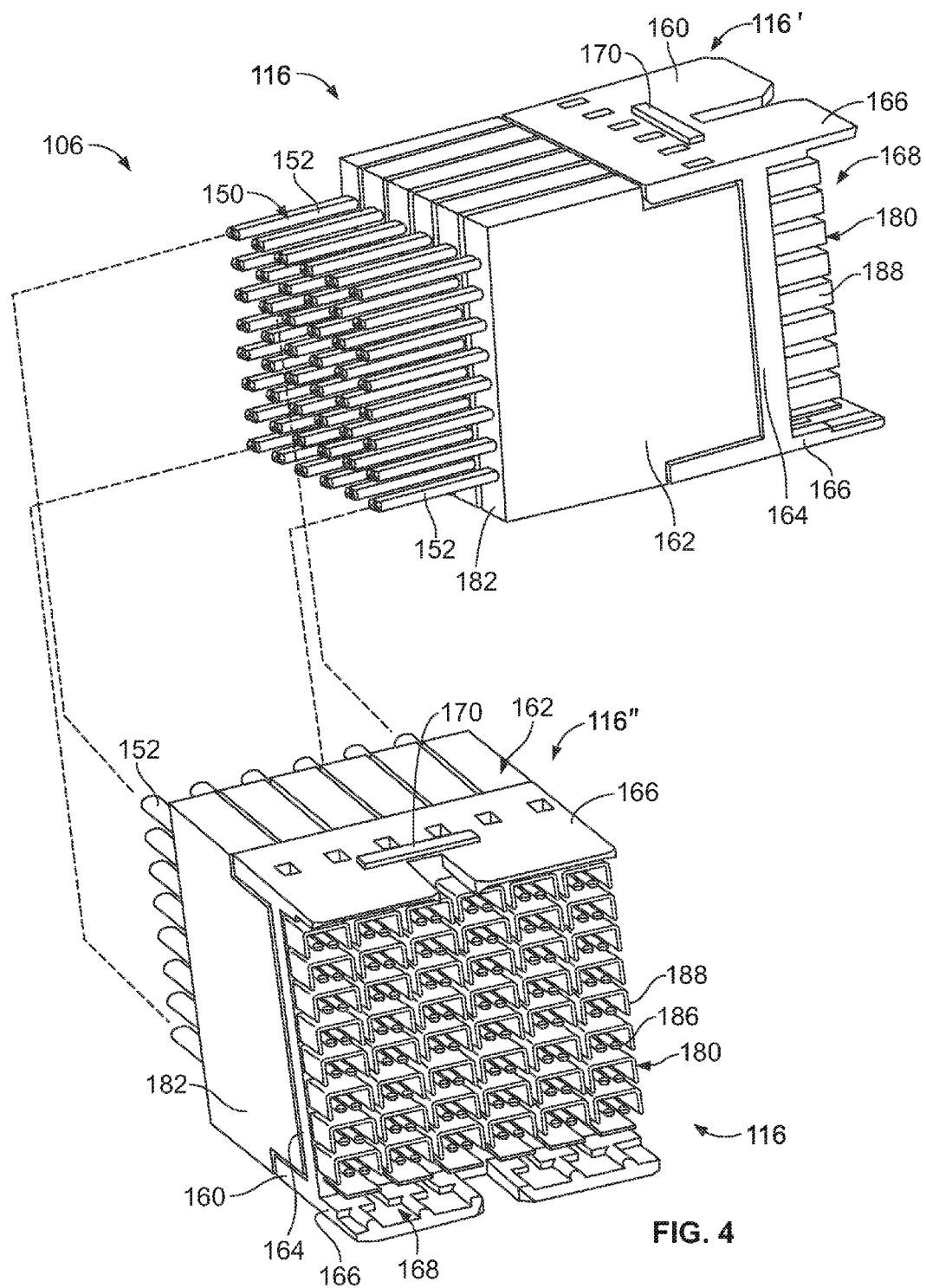
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header 160 holding a plurality of contact modules 162. The header 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header 160 has lugs 170 extending outward from the shroud walls 166. The lugs 170 are used to locate the cable connector 116 with respect to the corresponding cable tray 114 (shown in FIGS. 2 and 3).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference. The cable assemblies 180 may be provided with greater or fewer signal contacts 186 in alternative embodiments. The cable assemblies 180 may be provided without the ground shields 188 in alternative embodiments. The cable assemblies 180 may be provided with different shaped ground shields 188 in alternative embodiments.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180. The contact modules 162 may be provided without the support bodies 182 in alternative embodiments.

Multiple contact modules 162 are loaded into the header 160. The header 160 holds the contact modules 162 in parallel such that the cable assemblies 180 are aligned in parallel columns. Any number of contact modules 162 may be held by the header 160 depending on the particular application. When the contact modules 162 are stacked in the header 160, the cable assemblies 180 may also be aligned in rows.

Figure 5:
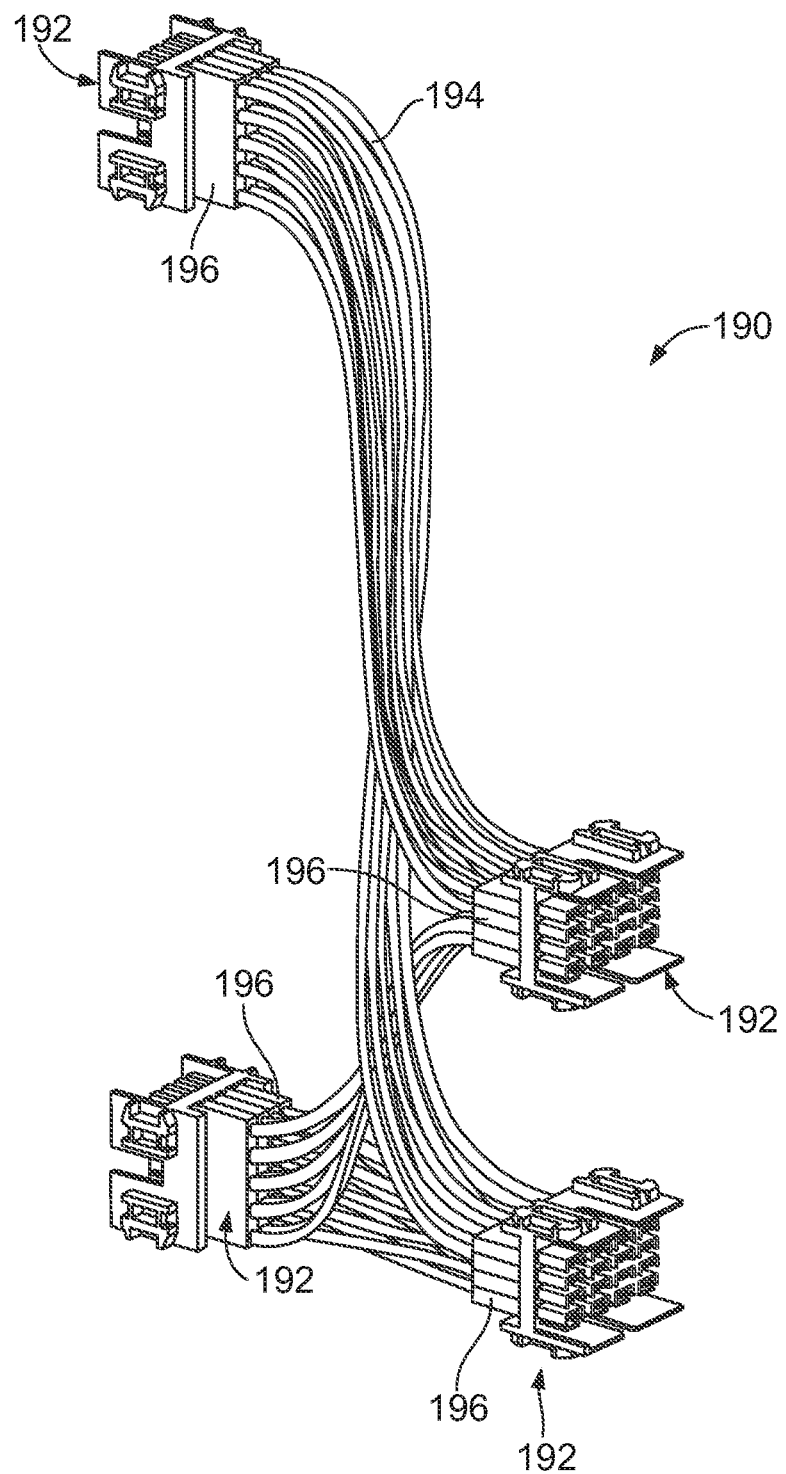
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
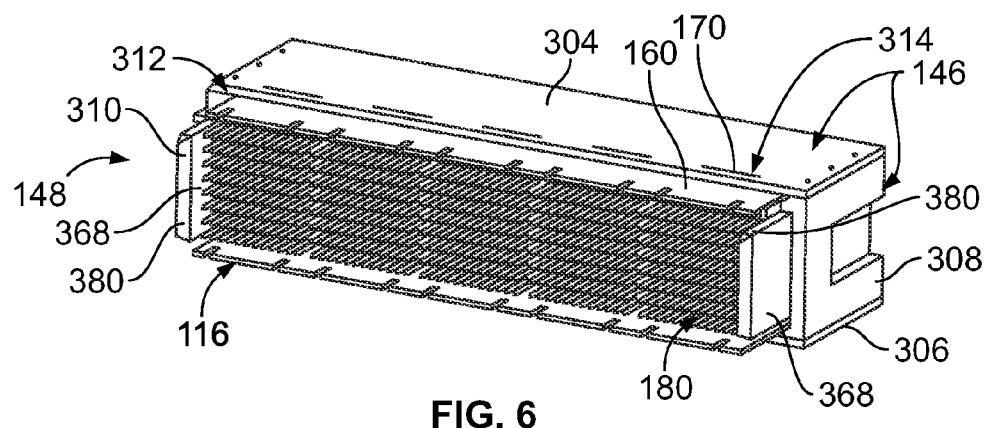
FIG. 6 is a front perspective view of a connector brick for the cable rack and formed in accordance with an exemplary embodiment.

FIG. 6 is a front perspective view of a connector brick 148 formed in accordance with an exemplary embodiment. The connector brick 148 includes the header frame 146 that holds the cable connectors 116. In the illustrated embodiment, the header frame 146 include a pair of end spacers 304, 306 and a pair of side spacers 308, 310 extending between the end spacers 304, 306. The side spacers 308, 310 are blocks positioned between the end spacers 304, 306 to control the spacing between the end spacers 304, 306. The end spacers 304, 306 may be secured to the side spacers 308, 310, such as by threaded fasteners.

A header opening 312 is defined between the end spacers 304, 306 and the side spacers 308, 310. The headers 160 of the cable connectors 116 are received in the header opening 312. The header opening 312 may be sized to receive any number of headers 160, such as by lengthening or shortening the end spacers 304, 306. Optionally, the header frame 146 is sized to align the headers 160 in a single row within the header opening 312. For example, the side spacers 308, 310 control the spacing between the end spacers 304, 306 to a single header width.

In an exemplary embodiment, the end spacers 304, 306 are generally planar plates having a rectangular shape; however, other shapes are possible in alternative embodiments. The end spacers 304, 306 include elongated slots 314 that receive corresponding lugs 170 (shown in FIG. 4) of the headers 160. The slots 314 may be oversized relative to the lugs 170 to allow a limited amount of floating movement of the headers 160 relative to the header frame 146. As such, when the connector bricks 148 are held in the cable trays 114 (shown in FIG. 3), the headers 160 are movable relative to the cable trays 114, such as for alignment with the connector channels 136 of the organizer plate 118 (both shown in FIG. 3), the connector openings 126 of the backplane circuit board 120 (both shown in FIG. 1), and/or the mating connectors 132, 134 of the line and switch cards 102, 104 (all shown in FIG. 1).

The side spacers 308, 310 have guide features 320 extending forward therefrom, which in the illustrated embodiment are guide paddles and may be referred to hereinafter as guide paddles 320. The guide paddles 320 extend along the headers 160 and cable assemblies 180 of the cable connectors 116. The guide paddles 320 protect the cable assemblies 180. The guide paddles 320 are used to guide loading of the connector brick 148 into the connector channel 136 of the organizer plate 118 (both shown in FIG. 3).

Figure 7:
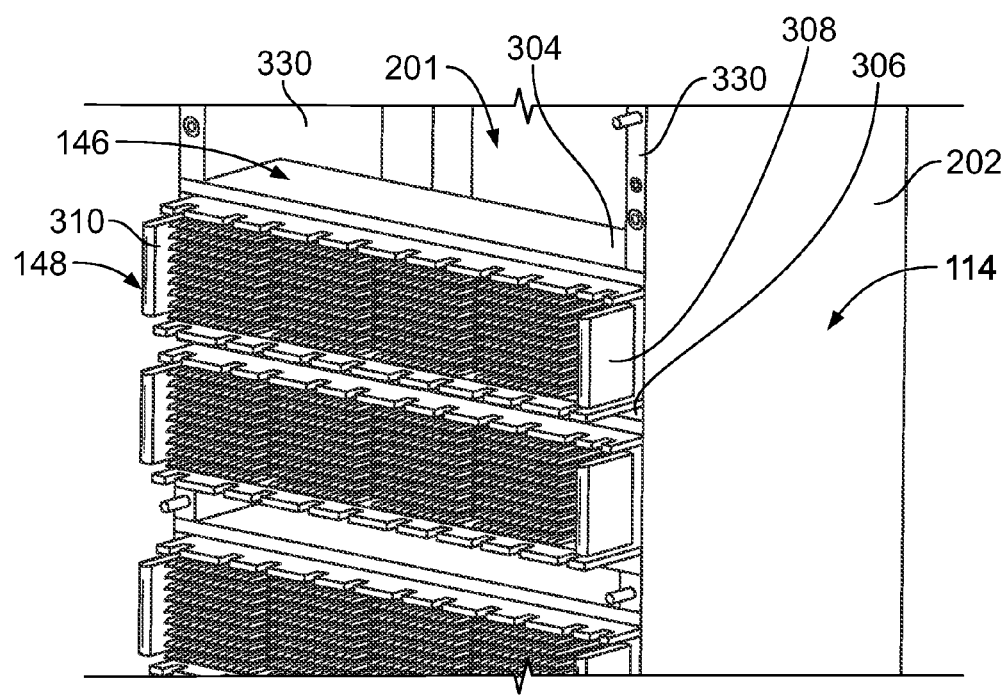
FIG. 7 illustrates the connector brick loaded in the cable tray.

FIG. 7 illustrates the connector bricks 148 loaded in the cable tray 114. In an exemplary embodiment, the header frames 146 include side frames 330 that support the connector bricks 148. The side frames 330 are secured to the side walls 202 of the cable tray 114. The side spacers 308, 310 and/or the end spacers 304, 306 may be secured to the side frames 330, such as by threaded fasteners (not shown). The side frames 330 position the connector bricks 148 relative to one another within the cable tray 114. Optionally, the connector bricks 148 may be pre-assembled to the side frames 330 prior to loading the side frames 330 into the cavity 201 of the cable tray 114. In an alternative embodiment, rather than using the side frames 330, the connector bricks 148 may be secured directly to the side walls 202 of the cable tray 114.

Optionally, the connector bricks 148 may be positioned immediately adjacent one another. Alternatively, the connector bricks 148 may be spaced apart from one another by a predetermined spacing, such as to accommodate parts of the organizer plate 118 (shown in FIG. 3), backplane circuit board 120 (shown in FIG. 1) and/or chassis 110 (shown in FIG. 1).

Figure 8:
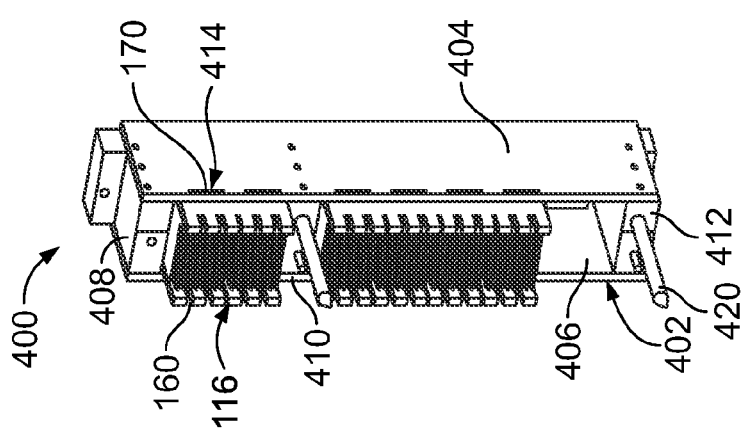
FIG. 8 is a front perspective view of a connector brick for the cable rack and formed in accordance with an exemplary embodiment.

FIG. 8 is a front perspective view of a connector brick 400 formed in accordance with an exemplary embodiment. The connector brick 400 includes a header frame 402 that holds the cable connectors 116. In the illustrated embodiment, the header frame 402 include a pair of end spacers 404, 406 and a side spacers 408, 410, 412 extending between the end spacers 404, 406. The side spacers 408, 410, 412 are blocks positioned between the end spacers 404, 406 to control the spacing between the end spacers 404, 406. The end spacers 404, 406 may be secured to the side spacers 408, 410, 412 such as by threaded fasteners. Optionally, the side spacer 410 is positioned between groups of cable connectors 116, thus separating the groups of cable connectors 116.

In an exemplary embodiment, the end spacers 404, 406 are generally planar plates having a rectangular shape; however, other shapes are possible in alternative embodiments. The end spacers 404, 406 include elongated slots 414 that receive corresponding lugs 170 (shown in FIG. 4) of the headers 160. The slots 414 may be oversized relative to the lugs 170 to allow a limited amount of floating movement of the headers 160 relative to the header frame 402. As such, when the connector bricks 400 are held in the cable trays 114 (shown in FIG. 3), the headers 160 are movable relative to the cable trays 114, such as for alignment with the connector channels 136 of the organizer plate 118 (both shown in FIG. 3), the connector openings 126 of the backplane circuit board 120 (both shown in FIG. 1), and/or the mating connectors 132, 134 of the line and switch cards 102, 104 (all shown in FIG. 1).

The side spacers 410, 412 have guide features 420 extending forward therefrom, which in the illustrated embodiment are guide pins and may be referred to hereinafter as guide pins 420. Any of the side spacers 408, 410, 412 may include guide pins 420 and any of the spacers 408, 410, 412 may be devoid of guide pins 420. The guide pins 420 are used to guide loading of the connector brick 400 into the connector channel 136 of the organizer plate 118. The guide pins 420 may be used to guide mating with the backplane circuit board 120. The guide pins 420 may be used to guide mating with the line or switch cards 102, 104.

Figure 9:
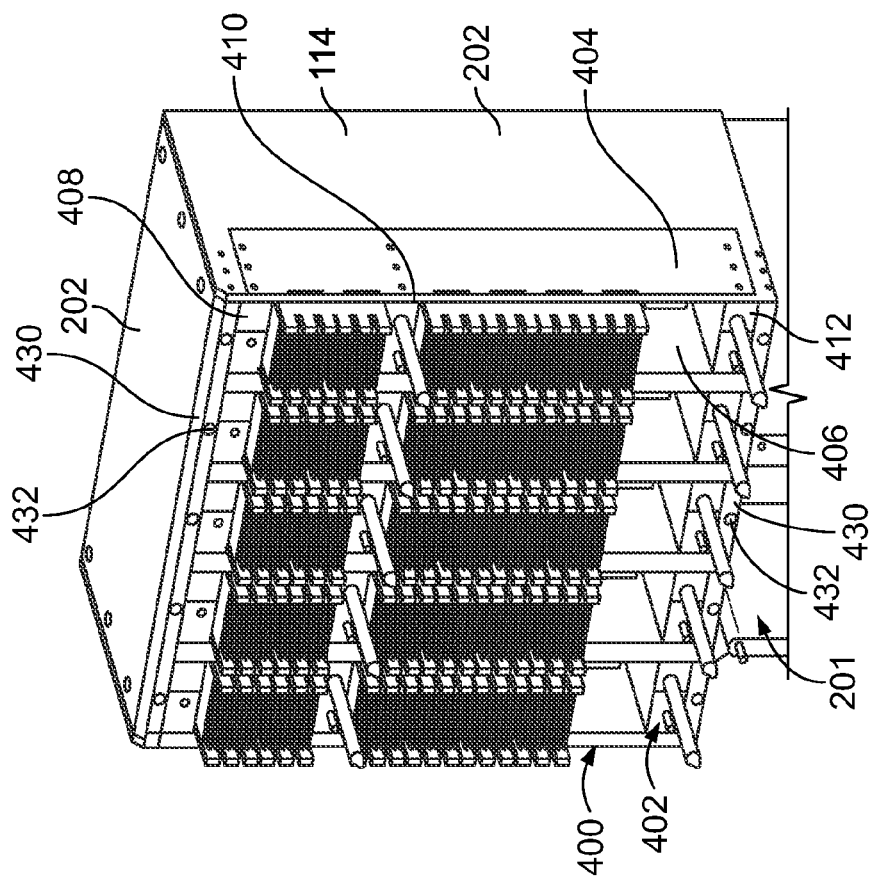
FIG. 9 illustrates the connector brick loaded in the cable tray.

FIG. 9 illustrates the connector bricks 400 loaded in the cable tray 114. In an exemplary embodiment, the header frames 402 include side frames 430 that support the connector bricks 400. The side frames 430 are secured to the side walls 202 of the cable tray 114. The side spacers 408, 410, 412 and/or the end spacers 404, 406 may be secured to the side frames 430, such as by threaded fasteners 432. The side frames 430 position the connector bricks 400 relative to one another within the cable tray 114. Optionally, the connector bricks 400 may be pre-assembled to the side frames 430 prior to loading the side frames 430 into the cavity 201 of the cable tray 114. In an alternative embodiment, rather than using the side frames 430, the connector bricks 400 may be secured directly to the side walls 202 of the cable tray 114.

Optionally, the connector bricks 400 may be positioned immediately adjacent one another. Alternatively, the connector bricks 400 may be spaced apart from one another by a predetermined spacing, such as to accommodate parts of the organizer plate 118 (shown in FIG. 3), backplane circuit board 120 (shown in FIG. 1), and/or chassis 110 (shown in FIG. 1).

Figure 10:
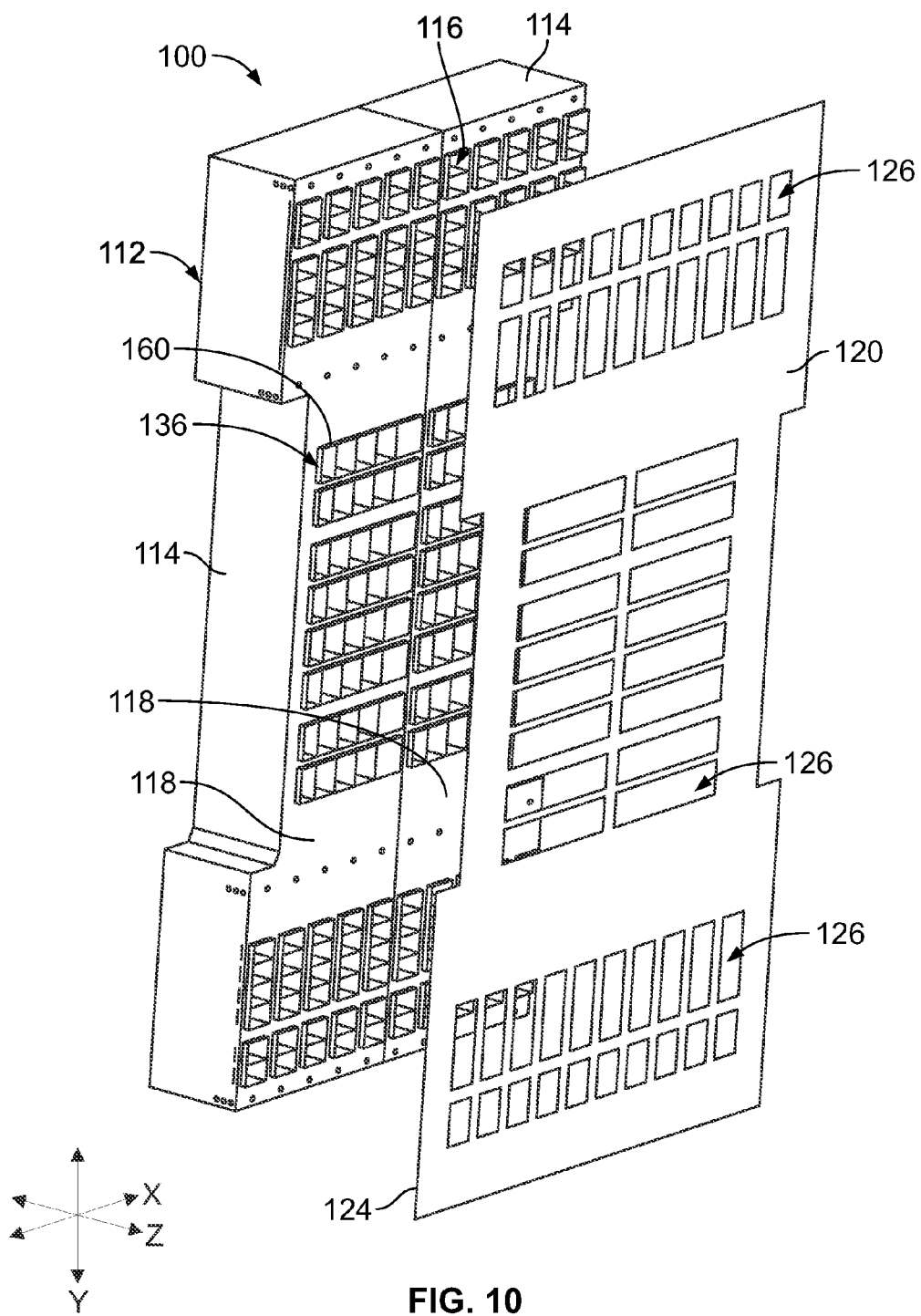
FIG. 10 is a partial assembled view of the cable backplane system showing the cable rack poised for assembly onto a backplane circuit board.

FIG. 10 is a partial assembled view of the cable backplane system 100 showing the cable rack 112 poised for assembly onto the backplane circuit board 120. Optionally, the backplane circuit board 120 may be pre-assembled to the chassis 110 (shown in FIG. 1). The cable rack 112, having the organizer plates 118 coupled to the cable trays 114, is positioned at the rear 124 of the backplane circuit board 120. The organizer plates 118 hold the nominal positions of the cable connectors 116 such that the cable connectors 116 may be loaded into the corresponding connector openings 126 in the backplane circuit board 120. For example, the organizer plates 118 may hold mutually perpendicular X, Y, and Z positions of the headers 160 with respect to one another. The connector openings 126 may be slightly oversized such that the cable connectors 116 easily pass through the backplane circuit board 120 without stubbing or interference. For example, the connector openings 126 in the backplane circuit board 120 are larger than the connector channels 136 in the organizer plate 118 such that the organizer plate 118 ensures alignment of the headers 160 with the connector openings 126 without the chance of stubbing. Assembly of the cable backplane system 100 is made easier with the use of the organizer plates 118, which hold the positions of the cable connectors 116 relative to one another. The assembler does not need to align the individual cable connectors 116 with the connector openings 126, as such alignment is performed by the organizer plates 118.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
   a plurality of cable connectors interconnected by cables, each cable connector having a header holding signal contacts at a mating end of the header and configured for mating with a card connector;
   a cable tray having side walls surrounding a cavity defining a raceway for the cables, the cable tray having a front edge, the cable tray holding a plurality of header frames between the side walls, each of the header frames holding the headers of corresponding cable connectors; and
   an organizer plate coupled to the cable tray at the front edge to close the cavity and cover the header frames, the organizer plate having a plurality of connector channels receiving mating ends of corresponding headers associated with multiple header frames, the connector channels holding the headers associated with different header frames in position relative to one another.

2. The cable backplane system of claim 1, wherein the organizer plate holds mutually perpendicular X, Y, and Z positions of the headers with respect to one another.

3. The cable backplane system of claim 1, wherein the organizer plate is a sheet metal plate with cutouts defining the connector channels.

4. The cable backplane system of claim 1, wherein the organizer plate covers all of the header frames and includes connector channels for all of the headers.

5. The cable backplane system of claim 1, further comprising a backplane circuit board having connector openings, the organizer plate holding the headers in position for loading into corresponding connector openings of the backplane circuit board.

6. The cable backplane system of claim 1, wherein the connector channels are oversized relative to the headers received therein to allow a limited amount of floating movement of the headers relative to the organizer plate.

7. The cable backplane system of claim 1, wherein the organizer plate is secured to the header frames using fasteners.

8. The cable backplane system of claim 1, wherein the header frames comprise end spacers and side spacers separate and discrete from the end spacers and attached thereto, a plurality of the headers being held between the corresponding pair of end spacers and corresponding pair of side spacers to define a connector brick, the cable tray holding a plurality of the connector bricks, the organizer plate covering multiple connector bricks and receiving mating ends of corresponding headers from different connector bricks.

9. The cable backplane system of claim 8, wherein the end spacers comprise plates having slots, the headers comprising lugs received in corresponding slots, the slots being oversized relative to the lugs to allow a limited amount of floating movement of the headers relative to the end spacers.

10. The cable backplane system of claim 8, wherein each side spacer comprises a block secured between the corresponding end spacers, the side spacer comprising a guide feature extending from a front of the side spacer, the guide feature extending through the organizer plate.

11. The cable backplane system of claim 8, wherein the organizer plate includes longitudinal strips between connector channels, the longitudinal strips being positioned between headers from different bricks.

12. The cable backplane system of claim 1, wherein the organizer plate and cable tray are configured to be mounted to a chassis as a unit.

13. The cable backplane system of claim 12, wherein the chassis holds a backplane circuit board, the organizer plate and the cable tray being mounted to the chassis in a fixed position relative to the backplane circuit board.

14. A cable backplane system comprising:
a backplane circuit board having connector openings extending therethrough; and
a cable rack coupled to the backplane circuit board, the cable rack comprising:
a plurality of cable connectors interconnected by cables, each cable connector having a header holding signal contacts at a mating end of the header configured for mating with a card connector;
a cable tray having side walls surrounding a cavity defining a raceway for the cables, the cable tray having a front edge, the cable tray holding header frames between the side walls, the header frames holding headers of corresponding cable connectors; and
an organizer plate coupled to the cable tray at the front edge, the organizer plate having a plurality of connector channels receiving mating ends of corresponding headers, the connector channels holding the headers from different header frames in position relative to one another;
wherein the organizer plate holds the headers in alignment with the connector openings in the backplane circuit board to guide loading of the headers into the connector openings.

15. The cable backplane system of claim 14, wherein the headers are allowed to float relative to the connector channels and the connector openings for mating with the card connector.

16. The cable backplane system of claim 14, wherein the connector openings in the backplane circuit board are larger than the connector channels in the organizer plate such that the organizer plate ensures alignment of the headers with the connector openings.

17. The cable backplane system of claim 14, wherein the header frames comprise end spacers and side spacers, a plurality of the headers being held between the corresponding pair of end spacers and corresponding pair of side spacers to define a connector brick, the cable tray holding a plurality of the connector bricks.

18. The cable backplane system of claim 15, wherein the end spacers comprise plates having slots, the headers comprising lugs received in corresponding slots, the slots being oversized relative to the lugs to allow a limited amount of floating movement of the headers relative to the end spacers.

19. A cable backplane system comprising:
a plurality of connector bricks, each connector brick comprising a plurality of cable connectors interconnected by cables, each cable connector having a header holding signal contacts at a mating end of the header and configured for mating with a card connector, each connector brick comprising a header frame including end spacers and side spacers defining a header opening receiving the plurality of cable connectors;
a cable tray having side walls surrounding a cavity defining a raceway for the cables, the cable tray having a front edge, the cable tray holding the connector bricks in the cavity; and
an organizer plate coupled to the cable tray at the front edge and covering the plurality of connector bricks, the organizer plate having a plurality of connector channels receiving mating ends of corresponding headers, the connector channels holding positions of the headers associated with different connector bricks relative to one another.

20. The cable backplane system of claim 19, further comprising a backplane circuit board having connector openings, the organizer plate holding the positions of the headers for loading into corresponding connector openings of the backplane circuit board.

* * * * *